United States Patent [19]

Stach et al.

[11] Patent Number: 4,971,083

[45] Date of Patent: Nov. 20, 1990

[54] APPARATUS AND METHOD FOR CLEANING SOLDER PASTE FROM ITEMS ASSOCIATED WITH SURFACE MOUNT TECHNOLOGY MANUFACTURING

[75] Inventors: Steven R. Stach, Austin, Tex.; Jay R. Johnson, Doylestown, Pa.

[73] Assignees: Austin American Technology, Austin, Tex.; EMC Domestic, Inc., Pa.

[21] Appl. No.: 201,763

[22] Filed: Jun. 2, 1988

Related U.S. Application Data

[63] Continuation-in-part of Ser. No. 158,823, Feb. 22, 1988, abandoned.

[51] Int. Cl.$^5$ .............................................. B08B 3/02
[52] U.S. Cl. ..................................... 134/57 R; 134/94; 134/111; 134/180; 134/199; 134/200
[58] Field of Search ................. 134/74, 101, 111, 133, 134/137, 151, 172, 174, 176, 179, 180, 198, 199, 200; 239/251, 261

[56] References Cited

U.S. PATENT DOCUMENTS

| | | | |
|---|---|---|---|
| 3,406,697 | 10/1968 | Mitchell et al. | 134/200 X |
| 3,409,030 | 11/1968 | Schmidt | 239/261 X |
| 3,645,791 | 2/1972 | Sadwith | 134/176 X |
| 4,208,760 | 6/1980 | Dexter et al. | 134/133 X |
| 4,281,675 | 8/1981 | Pure | 134/199 X |
| 4,338,958 | 7/1982 | Fujita | 134/199 X |
| 4,406,408 | 9/1983 | Corneluis | 239/261 X |
| 4,427,019 | 1/1984 | Eidschun | 134/199 X |
| 4,452,264 | 6/1984 | Kreisel et al. | 134/199 X |
| 4,506,687 | 3/1985 | Rosch, III | 134/199 X |
| 4,694,527 | 9/1987 | Yoshizawa | 134/133 X |
| 4,739,780 | 4/1988 | Czaja et al. | 134/94 X |
| 4,808,237 | 2/1989 | McCormick et al. | 134/200 X |

Primary Examiner—Frankie L. Stinson
Attorney, Agent, or Firm—Gunn, Lee & Miller

[57] ABSTRACT

An apparatus and method for cleaning solder paste from stencils, screens, misprinted circuit boards, and tools associated with the manufacturing of surface mount technology circuit boards. The apparatus includes a holder assembly for holding the solder-laden objects during cleaning and rotatable spray arms connected with a chemical pump for spraying a transversely directed, cyclic waves of solvent onto the object's surfaces. The cleaning action of the spray arms permits use of the solvent at or below room temperature thereby substantially reducing evaporative loss of solvent, environmental injury resulting from such evaporative loss, and exposure of workers to solvent vapors. The apparatus includes filters for filtering heavy metal particles washed from the objects to contain the heavy metals for safe disposal. Safety mechanisms are included in the apparatus to prevent worker injury. The apparatus includes a timer/control unit which automatically controls the sequence and duration of the apparatus' components during a cleaning cycle. The method includes cleaning of solder paste by cyclically exposing the object surfaces to jets of solvent at directions constantly transverse to the surfaces thereby creating wavefronts of solvent which mechanically wipe solder paste from the surfaces.

20 Claims, 6 Drawing Sheets

APPARATUS AND METHOD FOR CLEANING SOLDER PASTE FROM ITEMS ASSOCIATED WITH SURFACE MOUNT TECHNOLOGY MANUFACTURING

CROSS REFERENCE TO OTHER APPLICATIONS

This application is a Continuation-in-Part Application of pending prior application Ser. No. 158823 filed Feb. 22, 1988 now abandoned by the same inventors for an Apparatus and Method for Cleaning Solder Paste From Items Associated With Surface Mount Technology Manufacturing which application is incorporated herein by reference.

BACKGROUND OF THE INVENTION

1. Field of the Invention

The present invention pertains to cleaning solder paste from stencils, screens, and tools used in producing surface mount technology circuit boards.

2. Background of the Invention

Stencils, screens, and tools used in manufacturing surface mount technology (S.M.T.) circuit boards require frequent cleaning because the solder paste which is deposited on circuit boards during manufacturing accumulates on these items through repeated use. Such solder paste buildup obstructs the smaller apertures on the stencils and screens and reduces the precision with which the tools may be used. In addition, occasionally misprinted boards are often discarded for lack of an effective and inexpensive method for cleaning the solder paste from the boards. Presently, stencils, screens, and tools (hereinafter usually referred to collectively as "stencils") are typically cleaned by manually applying a halogenated hydrocarbon-based solvent and using a stiff brush to scrape the solder paste from the stencil surfaces. In the alternative, stencils are cleaned using machines having a conveyor assembly which carries the stencils past fixed spray nozzles.

The above methods for cleaning S.M.T. stencils require that solvent be used at elevated temperatures, usually on the order of approximately thirty-eight (38) degrees Celsius. This is necessary because of the inefficient cleaning effect of the solvent when used in such a manner. Use of solvent at such temperatures causes substantial evaporative loss of solvent, environmental injury resulting from solvent release into the atmosphere, and worker exposure to solvent vapors. Furthermore, exposure of the material by which S.M.T. stencils are usually suspended within their frames to heated solvents tend to damage that material thereby requiring more frequent replacement of the stencil/frame combinations than would be necessary if solvent were used at or below room temperature.

Solder paste contains lead which is removed from S.M.T. stencils during cleaning. Worker exposure to lead is a health concern which is addressed by strict government standards. Cleaning S.M.T. stencils by the above-referenced methods do little, if any, to address the lead exposure or collection problems.

SUMMARY OF THE INVENTION

It is an object of the present invention to provide an apparatus for cleaning solder paste from surface mount technology stencils, screens, misprinted circuit boards, and production tools.

It is another object of the present invention to provide an apparatus for cleaning solder paste from surface mount technology stencils, screen, misprinted circuit boards, and production tools which apparatus minimizes evaporative loss of cleaning solvent.

It is another object of the present invention to provide an apparatus for cleaning solder paste from surface mount technology stencils, screen, misprinted circuit boards, and production tools which apparatus distills particulate-saturated solvent for repeated use.

It is another object of the present invention to provide an apparatus for cleaning solder paste from surface mount technology stencils, screen, misprinted circuit boards, and production tools which apparatus minimizes worker exposure to cleaning solvents.

It is another object of the present invention to provide an apparatus for cleaning solder paste from surface mount technology stencils, screen, misprinted circuit boards, and production tools which apparatus minimizes exposure of workers to lead particulates derived from the solder paste.

It is another object of the present invention to provide an apparatus for cleaning solder paste from surface mount technology stencils, screen, misprinted circuit boards, and production tools which apparatus permits use of cleaning solvents at or below room temperature.

It is another object of the present invention to provide an apparatus for cleaning solder paste from surface mount technology stencils, screen, misprinted circuit boards, and production tools which apparatus filters the cleaning solvent used in its operation for extending the useful life of such solvent.

It is another object of the present invention to provide an apparatus for cleaning solder paste from surface mount technology stencils, screen, misprinted circuit boards, and production tools which apparatus is designed for substantially risk-free operation by workers.

It is another object of the present invention to provide an apparatus for cleaning solder paste from surface mount technology stencils, screen, misprinted circuit boards, and production tools which apparatus cleans such stencils, screen, misprinted circuit boards, and production tools in substantially less time than is required when cleaning these items by alternative methods.

It is another object of the present invention to provide an apparatus for cleaning solder paste from surface mount technology stencils, screens, misprinted circuit boards, and production tools which apparatus permits automated cleaning of a stencil following insertion of the stencil by a worker.

It is another object of the present invention to provide an apparatus for cleaning solder paste from surface mount technology stencils, screens, misprinted circuit boards, and production tools which apparatus resists buildup of solder paste residue in said apparatus.

It is another object of the present invention to provide a method for cleaning solder paste from surface mount technology stencils and screens which method is optimally efficient, substantially risk free to method practitioners, elementary in practice, less destructive to stencils and screens than alternative methods, and more environmentally compatible that alternative methods.

In satisfaction of these and related objectives, the present invention teaches an apparatus and method for washing surface mount technology stencils with a fluorocarbon-based solvent or, alternatively, other halogenated-hydrocarbon solvents or water-based solvents with agents for rendering solder resin soluble in water. The solvent is propelled at elevated pressure by a chemical pump through two rotatable spray arm assemblies mounted on either broad side of a rectangular, sealed cleaning chamber. The spray arm assemblies rotate about a hub fixed on the cleaning chamber walls. The spray arm nozzles are oriented so solvent always strikes stencil surfaces transversely so waves of solvent pass over the stencil as the spray arms rotate. The waves of solvent effect a mechanical wiping action which augments the cleaning effect of the solvent. The elevated pressure at which the solvent is propelled against a stencil along with the wiping action enhances the cleaning effect of the solvent to the extent that the solvent may be effectively used at or below room temperature, thus substantially decreasing evaporative loss of solvent. This reduces worker exposure to solvent vapors, reduces the deleterious environmental effect of release of fluorocarbons into the atmosphere (when fluorocarbon-based solvents are used), and reduces operational costs attributable to solvent consumption.

The apparatus includes a stencil/frame holder which securely holds a stencil frame for cleaning and is track-mounted for moving in and out of the cleaning chamber. The stencil/frame holder is coupled with a drive mechanism powered by an electric motor. The top of the frame holder is designed to seal the cleaning chamber when it is lowered into the operating position.

To filter contaminants from the solvent as it is recirculated during a cleaning cycle, after leaving the cleaning chamber the solvent passes through a filter bag and through an in-line cartridge filter before returning to the spray arms. The filter bag and cartridge filter also serve to gather and contain lead particles from the solder paste for safe disposal as part of a compliance program with governmentally-prescribed standards relating to worker exposure to lead.

A solvent still is connected to the chemical pump via an alternative pipe route. A valve controls the flow from the pump as between the cleaning circuit and the alternative still circuit. Distillation of the solvent extends its service life considerably because it purifies solvent beyond the capabilities of the filters.

For purposes of safety, the apparatus includes mechanisms which prevent the stencil/frame holder from abruptly falling into the operating position in the event of a power failure. To prevent finger or hand injury as the frame holder lowers to the operating position, a user must simultaneously press a button on each side of the machine to actuate the motor which lowers the frame holder. A photoelectric "light curtain" is positioned about the perimeter of the apparatus and must be uninterrupted for the frame holder hoist motor to operate.

Operation of the apparatus in its automatic mode involves merely three steps: (1) placement of a stencil frame in the frame holder; (2) pressing the start buttons; and (3) removing the stencil frame from the stencil/frame holder at the end of the apparatus' cycle.

DETAILED DESCRIPTION OF THE PREFERRED EMBODIMENT

Figure 1:
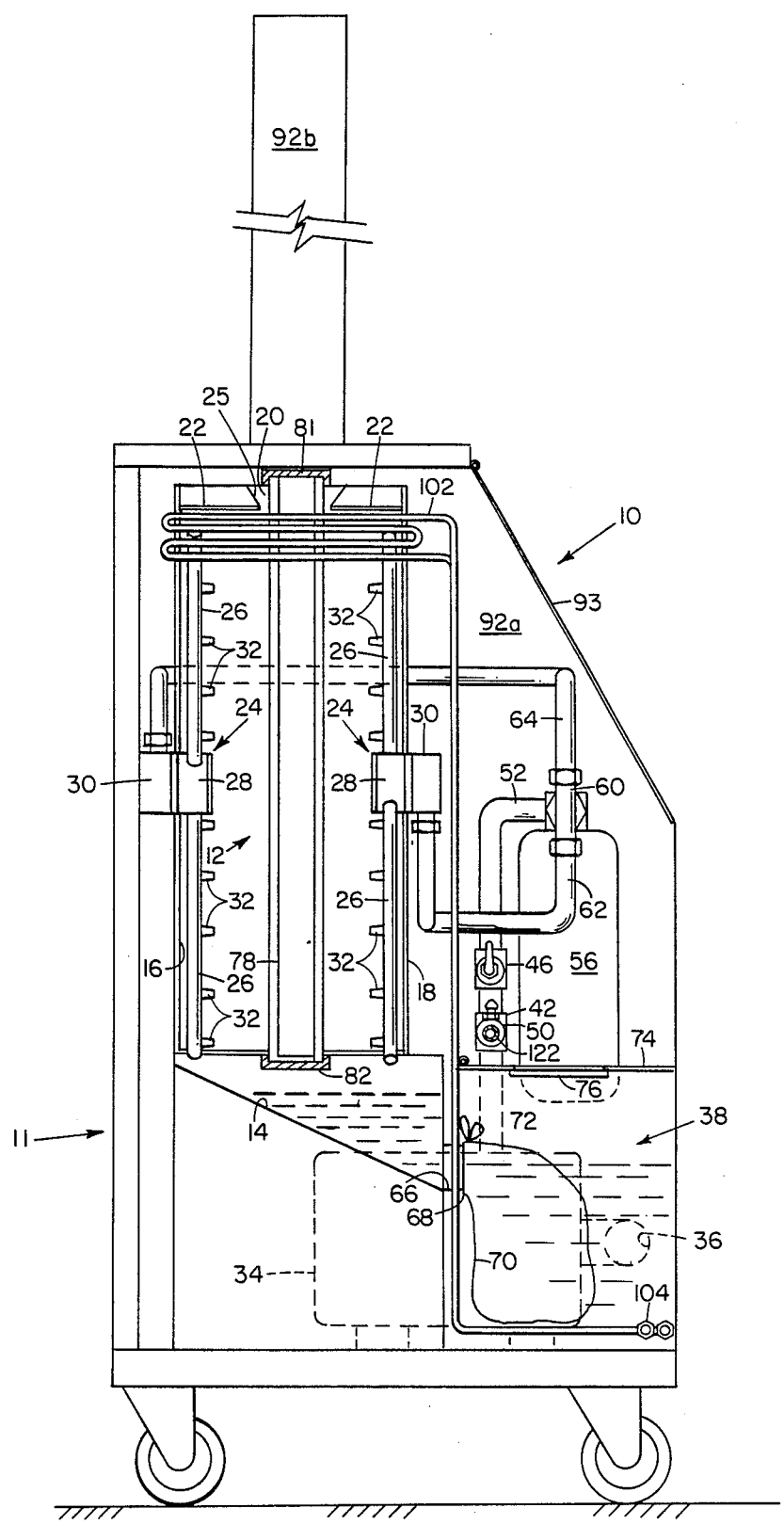
FIG. 1 is side cross sectional view of the preferred embodiment.

Referring to FIG. 1, the apparatus for cleaning solder paste from stencils, screens, misprinted boards, and tools associated with surface mount technology is identified generally by the reference numeral 10. The apparatus casing is identified by reference numeral 11. The casing 11 is constructed such that it is a leak-proof vessel which will contain any solvent leakage from the cleaning chamber 12 or from any of the components within the casing 11. Toward this end, a containment tray (not visible in the drawings) is situated in the base of the casing 11. Like all cabinet and plumbing members of the preferred embodiment of the apparatus 10, the casing 11 and the containment tray are fabricated of stainless steel to withstand exposure to any of the solvents which may be used in the apparatus 10 for its intended purposes. All welded seams are ground smooth for safety as well as aesthetic purposes.

The cleaning of stencils, screens, misprinted boards, and tools (hereinafter usually collectively referred to as "stencils," or "planar objects" in the claims) takes place in the rectangular cleaning chamber 12 situated within the casing 11.

The cleaning chamber 12 includes a cleaning chamber floor 14, a cleaning chamber front wall 16 and a cleaning chamber rear wall 18. The cleaning chamber floor 14 is sloped downward from the front cleaning chamber wall 16 to the rear cleaning chamber wall 18 at an angle no less than approximately twenty degrees (20), but most preferably on the order to thirty (30) degrees from the horizontal. The sloping is necessary to allow the solder paste which is washed from stencils and which are of specific gravities on the order of 8–10 gm/cm3 to flow out of the cleaning chamber 12 though a drain port (to be discussed hereinafter) and thereby prevent buildup of solder paste within the cleaning chamber to reduce apparatus maintenance requirements. The side walls of the cleaning chamber 12 are not depicted in FIG. 1.

The cleaning chamber 12 opens to the outside through a cleaning chamber opening 20 on its upper face. The cleaning chamber opening 20 is narrowed relative to the overall internal dimensions of cleaning chamber 12 by a baffle plate 22 which serves as the cleaning chamber's 12 upper face. It is the baffle plate 22 that defines the cleaning chamber opening 20. The opening 20 as measured perpendicularly to the front and rear cleaning chamber walls 16 and 18 is approximately three inches in width. This is little more than is required to pass a stencil frame into the cleaning chamber 12. The apparatus casing 11 is sealingly welded to the cleaning chamber 12 at the perimeter of the baffle plate 22. The shape of the casing 11 at its juncture with the baffle plate 22 and that of the member which mates with the casing 11 at that point to form a vapor tight seal during operation of the apparatus 10 will be discussed in detail hereinafter.

Referring in combination to FIGS. 1, 2, 8 and 9, two spray arm assemblies 24 are rotatably mounted within the cleaning chamber 12 respectively on the front cleaning chamber wall 16 and the rear cleaning chamber wall 18. Each spray arm assembly 24 comprises two spray arm tubes 26 which extend from a centrally located hub 28. The hub 28 is a cylindrical member with an axial hole passing therethrough and a bearing race 28a formed at either end to respectively accommodate two Turcite-A circular bearings 28b therein. The bearings are to have an exterior diameter for snugly fitting within the bearing races 28a and an interior diameter slightly smaller than that of the axial hole of the hub 28. Thus, the hubs' 28 contact with the spindle 29 (to be discussed hereinafter) is by way of the bearings 28b. Each hub 28 has two threaded orifices 28c in linear succession perpendicular to and intersecting the hubs' 28 axes at the hubs' 28 approximate axial midpoint. The spray arms 26 are complimentarily threaded for insertion at the orifices 28.

Each hub 28 is rotatably situated on a spindle 29. Each spindle 29 has a mounting base 29a, and a shaft 29b sized for snug but rotatable situation within the bearings 28b. A circumferential channel 29c approximately 0.165 inches in depth and having an approximately 0.50 inch radius is formed about the midpoint of each shaft 29b. Two holes 29d pass through the shaft 29b perpendicular to each other and perpendicular to and intersecting the shaft's 29b axis and intersecting the channel 29c. An axially oriented hole 29e opens at the mounting base end of the spindle 29 and extends into the shaft 29b to communicate with holes 29d. Hole 29e does not, however, open at the shaft end of the spindle 29. The shaft end of the spindle 29 has a number of threaded holes 29f for receiving bolts for holding the hub end cap 31 in place once the hub 28 is placed on the spindle 29. The mounting base 29a also has a number of equidistantly spaced, threaded holes 29g for receiving bolts which hold the spindles 29 securely against their respective cleaning chamber walls.

Each spindle 29 is connected to a cylindrical spray manifold 30, with the respective front cleaning chamber wall 16 or rear cleaning chamber wall 18 intervening each such pair. Each spray manifold 30 has one hole passing from a point on its annular surface to the axial center of the manifold 30. A second axially oriented hole 30b passes from one end of each manifold 30 and intersects the hole 30a for fluid communication with hole 29e of the spindle. The spray manifolds 30 have holes 30c in like number to holes 29g and complementarily arranged relative to the holes 29g in the mounting base 29a of the spindles 29 for allowing bolts to pass through the manifolds 30, through appropriate holes in the cleaning chamber walls 16 or 18, and into the holes 29g of the spindles 29 thereby securing the spray arm assemblies 24 to the cleaning chamber walls.

The spray arms 26, spindles 29, hubs 28, end caps 31, and spray manifolds 30 are made of polished stainless steel. This along with the Turcite A bearings 28b provide for near indefinite service life of the spray arm assemblies 24 regardless of the solvent used.

Referring in combination to FIGS. 1, 2, 10a, 10b, and 10c, each spray arm tube 26 has a number of spray nozzles 32 arranged in a single column along its length. The two tubes 26 of each spray arm assembly 24 are complimentarily-oriented relative to the hub 28 such that, when the spray arm assembly 24 is viewed from one end, the orifices of the nozzles 32 of one tube 26 are directed at a sixty (60) degree angle relative to the plane of rotation of the spray arm assembly 24 and the orifices of the nozzles 32 of the other tube 26 are directed at a one hundred twenty (120) degree angle relative to the plane of rotation. For faster or slower rotation of the spray arm assemblies 24, the angular displacement of the nozzles 32 from the tubes' 26 plane of rotation can be varied somewhat, although the above-referenced orientations have been determined superior overall through experimentation and computer modelling.

Figure 10A:
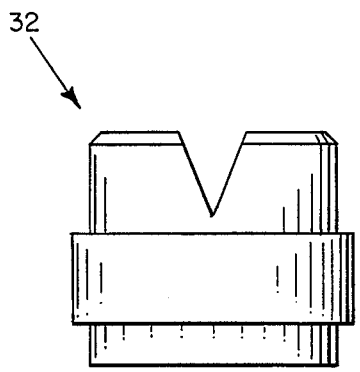
FIG. 10a is an elevational view of the preferred nozzle for use in applicants' invention.
Figure 10B:
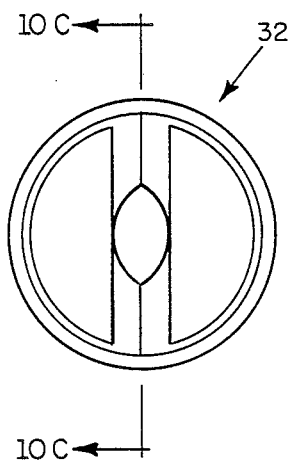
FIG. 10b is a top plan view of the preferred nozzle for use in applicants' invention.
Figure 10C:
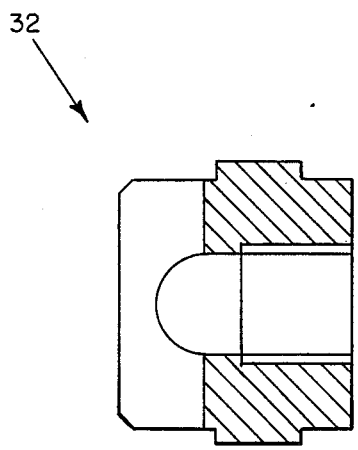
FIG. 10c is a cross sectional view of the preferred nozzle for use in applicants' invention.

Referring particularly to FIGS. 10a, 10b, and 10c, it has likewise been determined through experimentation and computer modeling that spray nozzles 32 of the design depicted in the drawings provide optimal cleaning for the apparatus as described herein. The nozzles 32 are evenly spaced at 3.3 inch intervals on the spray tubes 26 in the preferred embodiment of applicants' invention.

It is noted that larger apparatuses 10 may be built involving multiple spray arm assemblies 24 on each side of the cleaning chamber 12.

Figure 2:
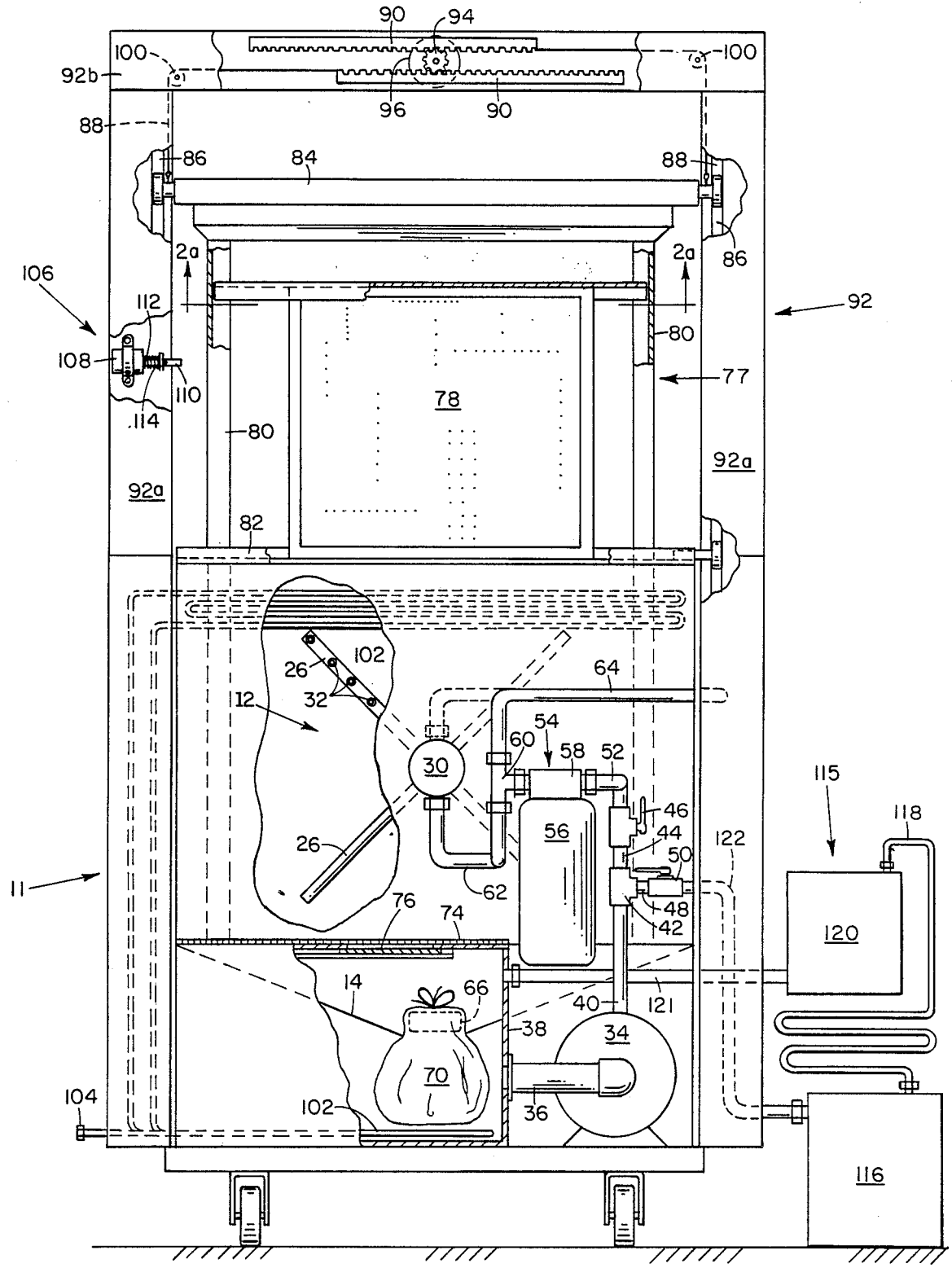
FIG. 2 is a rear elevational, partial cutaway of the preferred embodiment.

Referring principally to FIG. 2, the low-pressure side of a chemical pump 34 is connected via a pipe 36 with a sump tank 38 for drawing cleaning solvent (not shown in the drawings) from the sump tank 38 and pumping the solvent to the spray arm assemblies 24. The chemical pump 34 used in constructing the preferred embodiment is pump Model Number SC 150 manufactured by Price Pump Company. A pump of equivalent operational specifications (40 gallons per minute at 80 feet of water pressure) would be equally acceptable.

The connection of the chemical pump 34 with the holes 30a of the spray manifolds 30 and thereby with the spray nozzles 32 is by way of a pipe, valve, and filter network. The network includes a pipe 40 which is connected directly to the high-pressure side of the chemical pump 34. The pipe 40 is sealingly connected with one of the three orifices of a T-joint 42. The second in-line orifice of the T-joint 42 leads, by way of a pipe 44, to an in-line valve 46. The perpendicularly-oriented third orifice of the T-joint 42 leads, by way of a pipe 48, to an in-line valve 50.

The in-line valve 46 is connected by way of a pipe 52 to a filter cartridge assembly 54. The filter cartridge assembly 54 is for removing from the solvent particulates which pass through a filter bag (to be discussed hereinafter) but which are feasibly filtered by commercially available filter cartridges. The filter cartridge assembly 54 employs a disposable filter cartridge 56 which, like an automobile oil filter, is threadingly and sealingly engaged with a filter manifold 58. The filters used for the preferred embodiment are Model MI-KE-E5PC manufactured by Ecco. This particular filter cartridge 56 filters particulates down to 5 microns in diameter. It is noted that the filter cartridge assembly 54, although shown in the drawings within the confines of the apparatus casing 11, may instead be situated outside of the casing 11 for ease of filter changing.

The effluent side of the filter cartridge assembly 54 is connected by way of a T-joint 60 with a pipe 62 leading to the spray manifold 30 of the spray arm assembly 24 on the rear cleaning chamber wall 18 and with a pipe 64 leading to the spray manifold 30 (not visible in FIG. 2) for the spray arm assembly 24 on the front cleaning chamber wall 16.

Referring in combination to FIGS. 1 and 2, the fluid circuit for the apparatus 10 is completed by a cleaning chamber drain port 66 which passes, by way of a conduit 68, from the cleaning chamber 12 to the sump tank 38. One end of the conduit 68 is permanently attached by welding to the rear cleaning chamber wall 18 adjacent to the cleaning chamber floor 14 while the other end of the conduit 68 opens into the sump tank 38. The sump tank end of the conduit 68 has an exterior annular flange (not shown in the drawings). The flange is for permitting a filter bag 70 having a drawstring 72 at its opening to be secured over the conduit 68 to filter gross particulates from the solvent as it flows from the cleaning chamber 12.

Figure 2A:
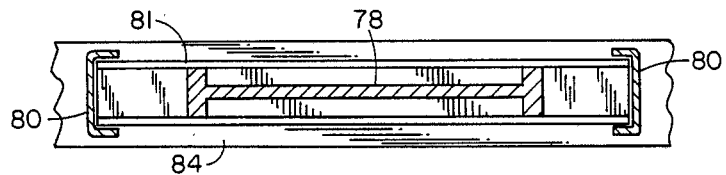
FIG. 2a is a partial cross sectional view of FIG. 2 along line 2a showing the relationship of the retainer rail and the vertical side members of the stencil/frame holder assembly with a stencil/frame combination positioned for cleaning by the preferred embodiment.

Referring to FIGS. 2 and 2a, the apparatus 10 includes a stencil/frame holder assembly 77 for holding a stencil/frame combination 78 and for carrying it into the cleaning chamber 12 for cleaning and thereafter withdrawing it for removal from the apparatus 10. The assembly 77 comprises two vertical side members 80, a lower stencil/frame support member 82, a stencil/frame support assembly top 84, and a restraining rail 81 slidably engaged with the side members 80. The restraining rail 81 rests on the top of, and thereby serves to hold, a stencil/frame combination 78 during cleaning.

Inserts may be placed within the channels of the restraining rail 81 and the support member 82 in which a stencil or screen frame resides during cleaning for holding narrower-printed circuit boards. This is advantageous for cleaning solder paste from misprinted circuit boards for reprinting. The inserts are not shown in the drawings.

The stencil/frame holder assembly top 84 is slidably engaged at either of its ends with a frame holder assembly hoist track 86 supported on upright members 92a of a gantry framework assembly 92. A hoist chain 88 is connected at either end of the stencil/frame holder assembly top 84 to portions of the stencil/frame holder assembly top 84 which extend through the tracks 86. At their respective other ends, the hoist chains 88 are attached to a rack 90. Two sprockets 100 are rotatably mounted at positions for supporting the hoist chains 88 at the transition of the hoist chains 88 from horizontal to vertical orientation as shown in FIG. 2. Each rack 90 is slidably mounted on the gantry framework cross member 92b at the uppermost portion of the gantry framework assembly 92 and is engaged with a pinion 94 mounted on the armature shaft 95 of a bi-directional hoist motor 96. The bi-directional hoist motor 96 is also mounted on the cross member 92b. It is noted that arrangements other than rack and pinion type hoist drive as shown in the drawings may be used for the moving the stencil/frame holder assembly. Such an alternative drive may involve a drive shaft and bevel, worm or crossed axis helical gear combination used to drive spools whereupon cables substituted for the chains 88 described herein are wound.

Figure 7:
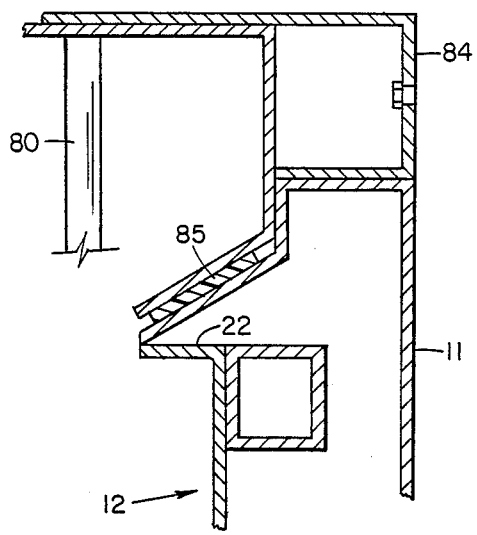
FIG. 7 is a cross sectional view of a portion of the stencil/frame support assembly top mated with the apparatus casing.
Figure 8:
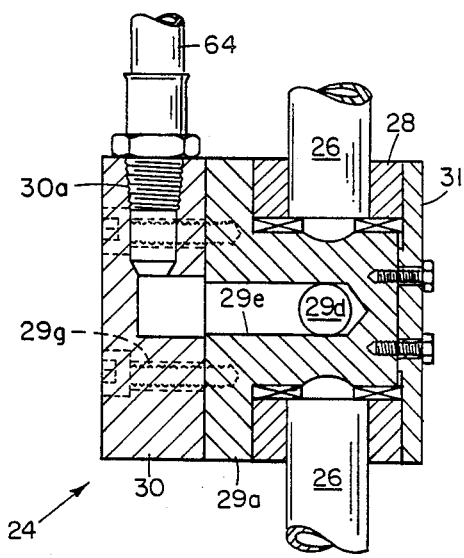
FIG. 8 is a cross sectional view of the hub/spindle portion of the assembled spray arm assembly of applicants' invention.
Figure 9:
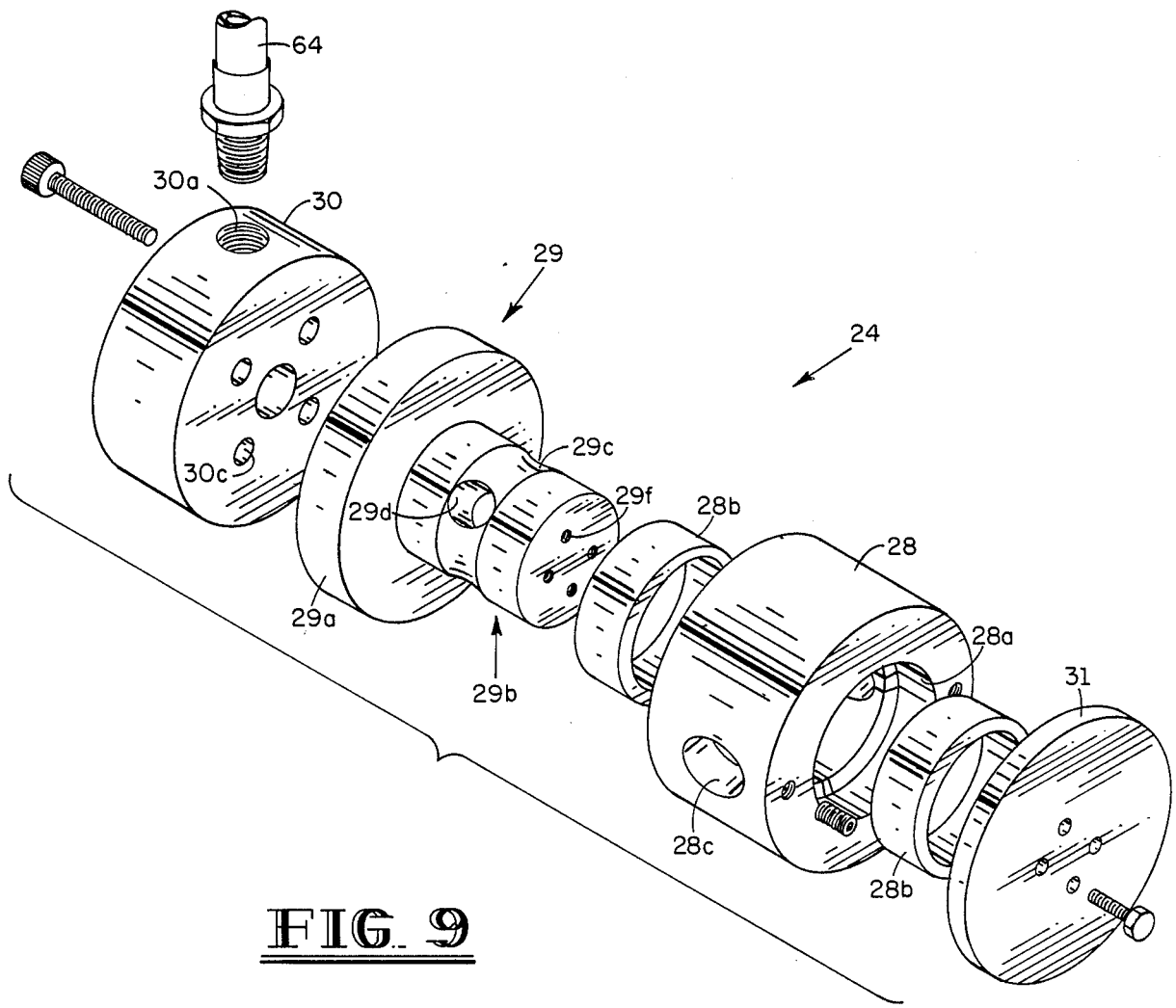
FIG. 9 is an exploded perspective view of the hub/spindle portion of the assembled spray arm assembly of applicants' invention.

Referring to FIGS. 2 and 7, the stencil/frame holder assembly top 84 and the casing 11 at its juncture with the baffle plate 22 are respectively shaped for mating with each other in "sauce pan lid" manner. This is for substantially sealing the cleaning chamber 12 during operation of the apparatus 10. A gasket 85 is provided along inward sloping lip of the casing as shown in FIG. 7.

Figure 3:
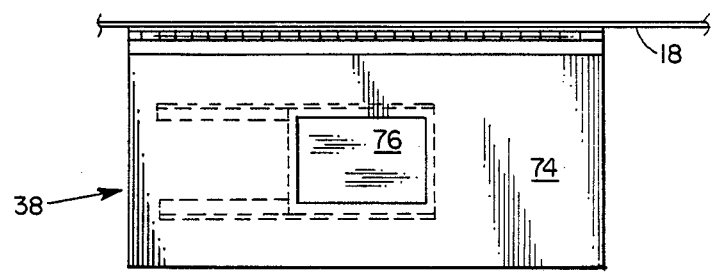
FIG. 3 is a top plan view of the sump tank lid of the preferred embodiment.

Referring to FIG. 3, a sump tank lid 74 is hingeably attached to the upper edge of the sump tank 38 which lies adjacent to the rear cleaning chamber wall 18. The sump tank lid 74 includes a sliding sump tank access panel 76 for opening instead of the sump tank lid 74 for checking solvent level.

Figure 4:
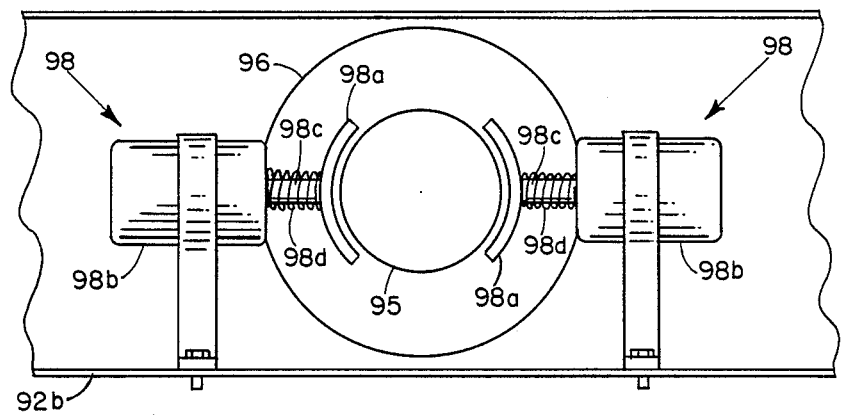
FIG. 4 is an elevational, partial cross sectional view of an electromagnetic hoist braking system of the preferred embodiment.

Referring to FIG. 4, a electromechanical hoist brake system 98 is mounted on the gantry framework cross member 92b and positioned relative to the motor's 96 armature shaft 95 to brake rotation of the armature shaft 95 when its brake shoes 98a are extended In addition to the brake shoes 98a, the hoist brake system 98 comprises two solenoids 98b each having a piston 98c on which the brake shoes 98a are mounted as shown. The polarity of each solenoid 98b is such that actuation of the solenoid 98b draws its piston 98c away from the armature shaft 95 to disengage brake shoes 98a from the armature shaft 95. Situated around each piston 98c is a spring 98d which holds the associated brake shoe 98a against the armature shaft 95 when the solenoid 98b is not under power.

A likely alternative to the just-referenced hoist brake arrangement is a braking apparatus made specifically for integration with the chosen motor 96. Such a braking apparatus is exemplified by brake assembly Model No. 5X400 available from Dayton Mfg. Co. of Dayton, OH and specifically made to be used with motors manufactured by that company.

Cooling coils 102 extend into the cleaning chamber 12 and into the sump tank 38. The preferred embodiment does not include a compressor or other portions of a refrigeration unit within the apparatus 10 itself; however, in alternative embodiments, such refrigeration components may be included. In the preferred embodiment, the coils 102 are connected at a refrigeration juncture 104 to external refrigeration components.

The purpose of the cooling coils 102 and associated refrigeration equipment (is included) is to cool the solvent used in operating the apparatus 10 to reduce solvent loss through evaporation (to be discussed in more detail hereinafter). One alternative to fluorocarbon-based refrigeration units is a cooled water-based system (not shown in the drawings) which, instead of cooling coils 102, would have tubes carrying chilled water or other suitable fluid from cooling means exterior to the apparatus 10.

A hoist safety stop 106 comprises a solenoid 108 securely mounted on one of the gantry framework upright members 92a with a ratchet lever 110 formed at the end of its piston 112 and a spring 114. In the solenoid's 108 rest state, the piston 112 is extended under force of the spring 114. When power is applied to the solenoid 108, the piston 112 is retracted. The hoist safety stop 106 is positioned adjacent to the stencil/frame holder assembly hoist track 86 such that the ratchet lever 110 extends through the slot in the track 86 when the piston 112 is extended. In this arrangement, the stencil/frame holder assembly top 84 may only pass the hoist safety stop 106 in a downward direction when the piston 112 is retraced under power applied to the solenoid 108. Because of the orientation of the ratchet lever 110 which may only move approximately ninety degrees in a single plane, the stencil/frame holder assembly top 84 may, however, pass the safety stop 106 in an upward direction whether or not the piston 112 is retracted.

Referring again to FIG. 2, a still 115 is provided for the preferred embodiment of the apparatus 10 for distilling solvent. Because the solvent is repeatedly used for cleaning solder paste from stencils, the solvent eventually becomes saturated with contaminants from the solder paste, even with the filtration system already discussed. Contaminant saturated solvent is less effective in cleaning stencils than is purer solvent. It is for this reason that the still 115 is included in the preferred embodiment.

The particular arrangement of the still 115 is not important so long as contaminated solvent may be heated in a distillation tank 116 having a heating element associated therewith (not separately shown in the drawings), the vapors rising from the solvent may pass through cooling coils 118, and the condensate may be collected in an recovery tank 120 which is connected by a pipe 121 to the sump tank 38 at an orientation whereby the distilled solvent may drain back into the solvent tank 38 under the influence of gravity. Although not shown in proper perspective in the drawings, the recovery tank 120 should be situated relative to the sump tank 38 such that the condensate returns to the sump tank 38 under force of gravity through pipe 121.

Solvent is flushed from the sump tank 38 by closing in-line valve 46 and opening in-line valve 50 thus directing solvent from the pump 34 out of the usual circuit through in-line valve 50. When the pump 34 is activated by a switch specifically for activating the pump 34 without activating the remainder of the electrically controlled components of the apparatus 10, the solvent is carried from in-line valve 50 to the still's distillation tank 116 by a pipe 122.

In an alternative embodiment (not depicted in the drawings), the manual in-line valves 46 and 50 may be replaced with electromechanical valves controlled by the hereinafter discussed timer/control unit. Such an arrangement would permit an unattended distillation cycle to occur at a pre-programed time whereat the timer/control unit automatically closes in-line valve 46, opens in-line valve 50 and actuates the pump 34. Such an unattended cycle programed to occur during nonuse hours would insure that the apparatus 10 is ready for each work day's use.

Figure 5:
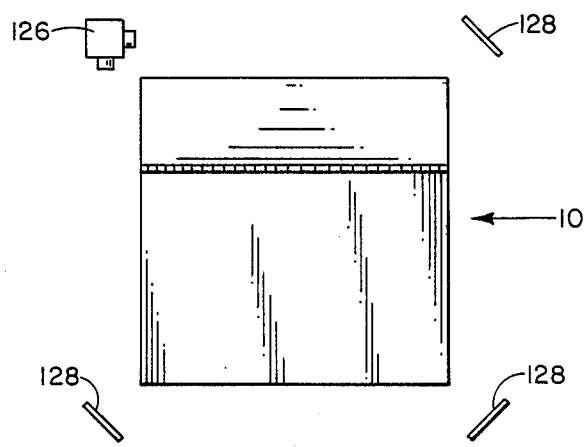
FIG. 5 is a top plan view of the arrangement of the light curtain system of the preferred embodiment.

Referring to FIG. 5, a light curtain system is included in the preferred embodiment. The system is primarily for insuring that no user's limbs are in the vicinity of the cleaning chamber opening 20 when the frame holder assembly top 84 comes to rest in the lowered, cleaning cycle position. The light curtain system is arranged with an optical transceiver 126 and three mirrors 128 positioned to project vertical, single plane light curtains to completely surround the apparatus 10 during operation. Interruption of any light curtain causes the light curtain system to send a signal to the hereinafter described light curtain cut-off switch to disable operation of the hoist motor 96, engage the hoist brake 98, and re-extend the ratchet lever 110. A separate optical transmitter and optical receiver may be substituted for the optical transceiver in an alternative embodiment of the apparatus 10 if cost considerations would be best served by the substitution.

It is noted that, while a physical barrier may satisfy substantially the same objectives as the just-described light curtain system, physical barriers, even with electric interlock mechanisms designed to "require" that they are closed for operation of machinery, often are "fooled" by users. The light curtain system tends to avoid worker short circuitry of the safety feature because there is no way, apparent to the novice user, to "fool" a light curtain system.

Figure 6:
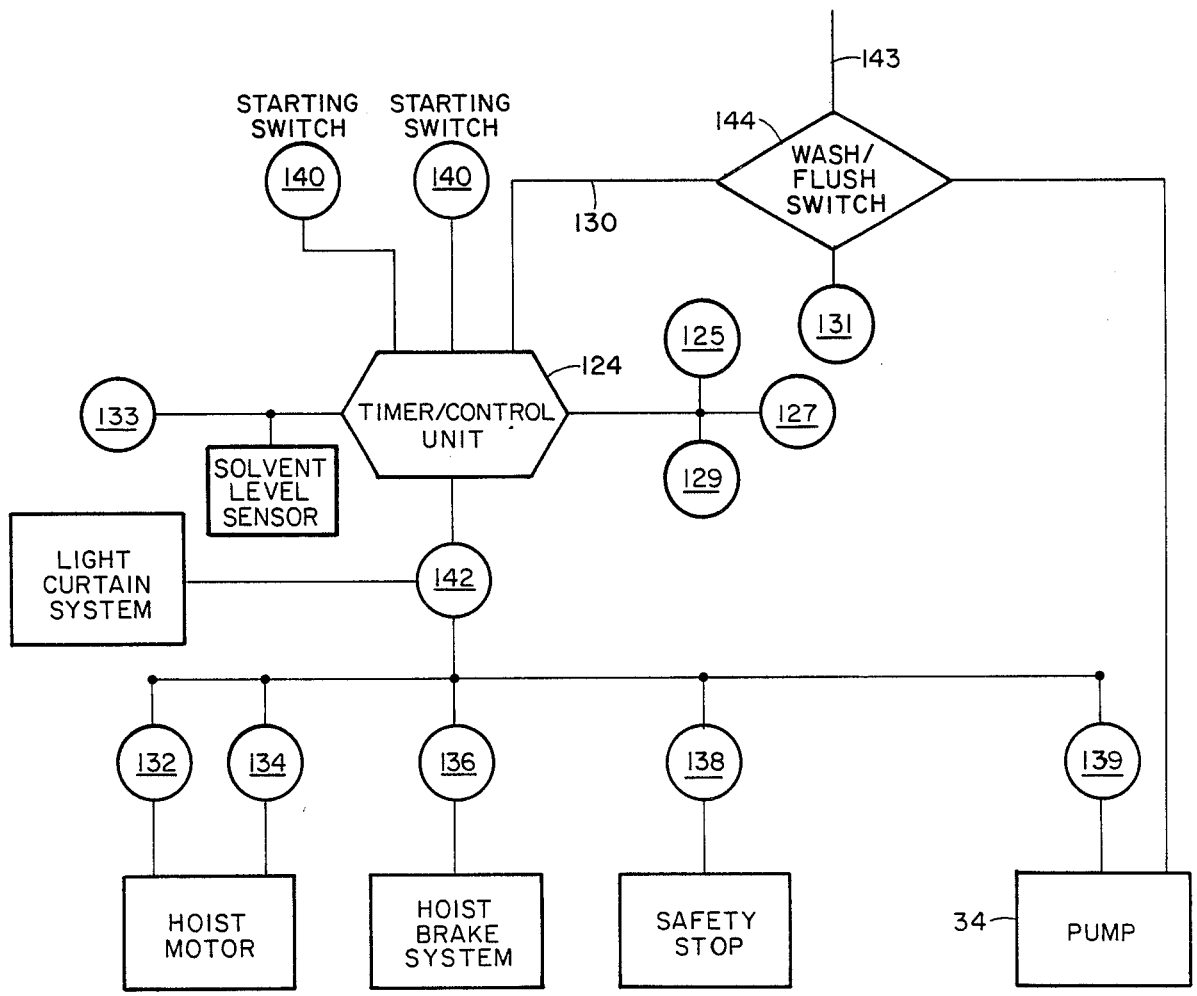
FIG. 6 is a schematic representation of the electromechanical components of the preferred embodiment.

Referring to FIG. 6, the electromechanical control aspects of the apparatus 10 are shown in block diagram form. The preferred embodiment includes a timer/control unit 124 which governs operation of the apparatus 10 through internal switching and timing devices which are well known in the art and are, therefore, not set out herein in detail. Electrical power for the apparatus 10 is initially supplied to the timer/control unit 124 through power line 130. The power is then directed to the proper apparatus components by the timer/control unit's 124 internal switches. Such internal switches include a hoist motor raising switch 132 which controls power to the hoist motor 96 for raising stencil/frame holder assembly, a hoist motor lowering switch 134 which controls power to the hoist motor 96 for lowering the stencil/frame holder assembly, a hoist brake switch 136 which controls power to the hoist brake system 98, a hoist safety stop switch 138 which controls power to the safety stop 106, a primary pump switch 139 which controls power to the pump 34, two starting switches 140 which, when pressed simultaneously, actuate the timer/control unit for one cleaning cycle. A light curtain cut-off switch 142 intervenes the timer/control unit 124 and the just described switches and serves to interrupt the power directed through these switches when a signal is received from the light curtain system. Such power interruption halts motion of the hoist motor 96, engages the hoist brake 98, and extends the ratchet lever 110 of the safety stop 106.

An indicator light panel is mounted on the casing 11 exterior (not visible in the drawings but lights thereon are represented in FIG. 6) for apprising an operator of the status of operation of the apparatus 10. The indicator lights should include a wash cycle indicator light 125, a hoist motor operation light 127, a drying cycle indicator light 129, a system flush position light 131 to indicate the position of the hereinafter described bi-directional wash/flush switch 144, and a low solvent level light 133. Lights 125, 127, and 129 are integrated with and governed by internal switches of the control unit 124. The system flush position light 129 is integrated with and controlled by the wash/flush switch 144. The low solvent level light is operably connected to a sensor situated in the sump tank 38 and positioned whereby the sensor is activated and the light 133 is lighted when the solvent in the sump tank 38 falls below a prescribed level. Sensors suitable for this purpose are well known in the art and are not described in detail herein or depicted in the drawings.

In the embodiment of applicant's invention which lacks the above-described components for an automatic distillation cycle, a bi-directional wash/flush switch 144 is included in the apparatus and is accessible by a user. The wash/flush switch 144 directs power from the primary power line 143 either to the timer/control unit 124 or directly to the pump 34. The wash/flush switch 144 is preferably a key operated switch because of the relative infrequency of its use. When the apparatus 10 is to be flushed for distilling contaminant-saturated solvent, the wash/flush switch 144 is switched from its normal "wash" position to the "flush" position. This should only be done, however, after turning in-line valves 46 and 50 and insuring that the pipe 122 is connected to the in-line valve 50 and to the distillation tank 116. The wash/flush switch 144 is connected to the flush position indicator light 131 such that the light 131 lights when the switch 144 is placed in the flush position.

The timer/control unit 124 and associated switches may be a simple electromechanical device such as is found in common clothes washing machines, or may be a more technically advanced solid state unit.

The two previously mentioned starting switches 140 are positioned on either side of the apparatus casing 11 no less than approximately eight inches from the uppermost portion of the casing 11 which adjoins the uppermost face of the cleaning chamber 12. The starting switches 140 are connected to the timer/control unit 124 which requires simultaneous activation of the two starting switches 140 to begin operation of the apparatus 10.

Upon activation of the timer/control unit 124 by simultaneously pressing both starting switches 140, the timer/control unit 124 carries out the following steps in the indicated order which steps collectively carry out one full operational cycle of the apparatus 10:

(1) the hoist brake switch 136 is placed in the "on" position to direct power to the solenoids 98b for disengaging the brake shoes 98a from the brake 98;

(2) the safety stop switch 138 is placed in the "on" position to direct power to the solenoid 108 for retracting the ratchet lever 110;

(3) the hoist motor lowering switch 132 is placed in the "on" position whereby the hoist motor 96 rotates counter clockwise (when viewed as in FIG. 2) and lowers the stencil/frame holder assembly top 84 to seal the cleaning chamber opening 20;

(4) the hoist motor operation light 127 is turned on;

(5) after the stencil/frame holder assembly top 84 is lowered, the hoist brake switch 136 is returned to the "off" position to allow the hoist brake system 98 to reengage;

(6) the safety stop sWitch 138 is returned to the "off" position to allow the piston 112 to re-extend;

(7) the hoist motor lowering switch 132 is returned to the "off" position;

(8) the hoist operation indicator light 127 is turned off;

(9) the pump switch 139 is placed in the "on" position for a predetermined period of time (the washing cycle) during which the pump 34 operates and the actual cleaning takes place;

(10) the wash cycle light 125 is turned on;

(11) at the end of the washing cycle, the pump switch 139 is returned to the "off" position and the wash cycle light 125 is turned off;

(12) the drying cycle light 129 is turned on and the timer/control unit 124 "waits" for a predetermined period of time (the drying cycle);

(13) after the drying cycle, the drying cycle light 129 is turned off, the hoist brake switch 136 is again placed in the "on" position to disengage the hoist brake system 98, and the hoist motor operation light 127 is turned on;

(14) the hoist motor raising switch 134 is placed in the "on" position whereby the hoist motor 96 rotates clockwise (when viewed as in FIG. 2) and raises the stencil/frame holder assembly top 84 to its starting position;

(15) the hoist brake switch 136 is again returned to the "off" position to allow the hoist brake 98 to reengage; and

(16) the hoist motor raising switch 134 is returned to the "off" position and the hoist motor operation light 127 is turned off.

Use of the apparatus 10 at any given cycle very simply involves lifting the restraining rail 81, positioning stencil/frame 78 below the restraining rail 81 and allowing the rail to rest on top of the stencil/frame 78 to securely hold it in position, and pressing the two starting buttons 140. Such use requires virtually no skill or training.

Several different solvents may be used in the apparatus 10. The most commonly used solvent is FREON TMS. Alternative solvents include 1,1,1 trichloroethane and water-based solvents with agents for dissolving the resin in solder paste. Whatever solvent is used, the solvent is placed in the apparatus 10 by filling the sump tank 38 through the sump tank access panel 76.

To permit use of any desired solvent, all components of the apparatus 10 coming into contact with the solvent should be of stainless steel, as previously mentioned, or should be otherwise designed to withstand exposure to halogenated hydrocarbons. If only water-based solvents or Freon TMS/solvent are to be used, the pipes and other feasibly substituted components may be of polyvinyl chloride.

Routine maintenance of the apparatus 10 is quite simple. Solvent is added to the sump tank 38 as needed and the filter bag 70 and filter cartridge 56 are replaced according to a schedule developed by each individual user as dictated by the size of stencils typically cleaned by that user and the average amount of solder paste on each stencil.

The apparatus 10 of the above-rendered design possesses a number of advantages over prior art devices which advantages will now be briefly discussed.

The most notable of the design feature-related advantages stems from the relative orientation of the spray arm tubes 26 on each spray arm assembly 24. The spray arm tubes' 26 orientation allows the force generated by the solvent as it is propelled through the orifices of the nozzles 32 to impart rotation to the spray arm assemblies 24. Most importantly, however, the orientation of the nozzles 32 requires that solvent flowing therefrom strike stencil surfaces at an angle whereby mechanically wiping "wave fronts" of solvent serve to wipe dislodged solder paste particles from the stencil's surface. As the wave fronts of solvent repeatedly pass over the stencil surface, virtually all solder paste is removed forcefully removed from the stencil.

The wave fronts of solvent resulting from the just-described spray arm design and orientation enhance the cleaning effect of the solvent to the extent that heating of the solvent, as is universally practiced at the present time, is not necessary. This, in turn, allows use of solvent at or below room temperature which, in turn, greatly reduces evaporative solvent loss. Use of solvent at cool temperatures also has been observed to prolong the life of the material from which stencils are suspended within their frames, as hot solvent tends to dissolve this material. Including cooling coils 102 (or alternatives as discussed above) in the apparatus 10 allows the user to maintain the solvent at a low temperature even during prolonged and substantially continued use thereby fully exploiting this advantage of the present invention.

In an effort to even further reduce the evaporative loss of solvent, the apparatus 10 has been designed to permit the least possible instances of disturbance of the solvent vapor levels in the day-to-day use and maintenance of the apparatus 10. Toward this end, the baffle plate 22 situated at the top of the cleaning chamber 12 has been included to reduce exposure of the vapors within the cleaning chamber 12 to outside air currents. Likewise, that the stencil/frame holder assembly top 84 seals the cleaning chamber during and for a time after the cleaning cycle further reduces evaporative loss of solvent.

The sliding sump tank access panel 76 is also designed for reducing instances of vapor level disturbance. Opening the sliding access panel 76 to check solvent level and/or to add solvent disturbs the vapor level within the sump tank 38 much less than opening the larger hinged sump tank lid 74; therefore, less solvent is moved into the surrounding atmosphere.

The design features of the apparatus 10 directed toward reducing evaporative solvent loss address well known environmental concerns relating to release of fluorocarbons and other solvent vapors into the atmosphere. While the most commonly used and effective solvents for cleaning solder-laden stencils contain fluorocarbons and, therefore, fluorocarbon release into the atmosphere will not be completely eliminated, the structure and operation of the apparatus 10 reduces consumption and atmospheric release of fluorocarbons to the greatest feasible degree.

Reduction of evaporative solvent loss also addresses health-related and economic concerns. By reducing the concentration of solvent vapors to which workers are exposed, substantial health risks are minimized. By reducing the evaporative loss of solvents, the manufacturer reduces solvent-related production costs.

A concern addressed by the apparatus' filtration system relates to worker exposure to the lead particulates which are removed from solder laden stencils during cleaning. The filter bag 70 and the filter cartridge 56 filters particulates from the solvent as the apparatus 10 operates. Workers with appropriate protective garments can safely remove the contained particulates by removing the filter bag 70 and filter cartridge 56 and by exchanging them with new ones. The filtration system also has an incidental economic benefit—by constantly filtering the solvent, the solvent may be used for a longer period of time before replacement or distillation.

Concerns relating to worker safety, in addition to those relating solvent vapor or heavy metal exposure, are also addressed in the design of the apparatus 10. The requirement of simultaneous activation of widely separated starting buttons 140 requires that activation of the apparatus 10 be deliberate; that is, when a user has properly placed a frame and stencil in frame holder assembly and is ready for the apparatus 10 to operate.

It is believed that the most likely injury that a user might incur in the absence of safety features would involve the frame holder assembly top 84 crushing body members between it and the edges of the cleaning chamber opening 20 as the top 84 is lowered into the washing cycle position. Such accidents are prevented, in part, by the hoist brake system 98 which arrests movement of the top 84 in the event of a power failure. Likewise, the safety stop 106 prevents the top 84 from falling to the cleaning chamber opening 20 in the event of a power failure because the ratchet lever 110 is extended to obstruct passage of the top 84 in a downward direction when power to the solenoid 108 is interrupted. Toward the same end, the above referenced light curtain system which, when breached during operation of the apparatus, causes the timer/control unit 124 to halt all operation, likewise makes crushing injuries at the juncture between the top 84 and the edges of the cleaning chamber opening 20 very unlikely.

The invention, as described herein, provides a new and useful apparatus and method for cleaning solder paste from stencils, screens, misprinted circuit boards, and production tools used in surface mount technology manufacturing more thoroughly and with less manual effort than any apparatus or method which is presently known to the public. Persons skilled in the art may recognize applications of the invention not specifically discussed herein; the appended claims are intended to cover the true scope of the invention, including such other applications.

We claim:

1. An apparatus for cleaning solder paste from a first surface of a substantially planar object comprising:

a first rotatable spray arm being situated within a cleaning chamber and rotatably supported on a first cleaning chamber wall of said cleaning chamber, said first spray arm having a plurality of nozzles along its length fixedly oriented for directing a liquid through said nozzles perpendicularly to said length of said first spray arm and transversely to a first plane of rotation of said first spray arm in a direction intersecting a second cleaning chamber wall opposite said first cleaning chamber wall, said cleaning chamber having a cleaning chamber external opening through which said planar object may be inserted and removed from said cleaning chamber and a cleaning chamber drain port through which said liquid may drain from said cleaning chamber;

a sump tank in fluid communication with said cleaning chamber drain port by means of a pipe sealingly attached to said drain port and extending into said sump tank for receiving all of said liquid which drains from said cleaning chamber;

a stencil/frame holder assembly for holding said planar object in said cleaning chamber so a surface of said planar object is oriented substantially parallel with said first plane of rotation and positioned whereby said liquid from said nozzles strikes said surface, said stencil/frame holder assembly being sized for carrying said planar object through said cleaning chamber's external opening for placing said planar object in said cleaning chamber or removing said planar object therefrom, said stencil/frame holder is a frame-like assembly comprising two vertically oriented side members rigidly joined to form a rectangular structure with a horizontally oriented stencil/frame holder top and a horizontally oriented stencil/frame support member, and further comprising a horizontally oriented retainer rail slidably engaged with said side members, said retainer rail and said stencil/frame support member each having a channel facing inward of said rectangular structure for securing said planar object for cleaning by said apparatus, said stencil/frame holder top and said stencil frame support member being slidably coupled with tracks joined with and supported by a gantry framework in turn mounted on and supported by said apparatus casing, said tracks extending from said cleaning chamber external opening to an area outside of said cleaning chamber along said gantry framework sufficient for slidably carrying said planar object held by said stencil/frame holder fully into and from said cleaning chamber;

chamber sealing means for substantially sealing said cleaning chamber external opening with said stencil/frame holder assembly within said cleaning chamber;

a pump having an input port and an output port for propelling said liquid introduced into said input port at a low pressure frame said output port at an elevated pressure;

a first conduit assembly in sealed fluid communication with a sump tank exit port and with said pump's input port for drawing said liquid from said sump tank to said input port;

a second conduit assembly in sealed fluid communication with said pump's output port and with said first rotatable spray arm for conducting said liquid from said pump to said first spray arm;

an apparatus casing sized and shaped for substantially enclosing within its bounds said cleaning chamber, said sump tank, said pump, said first conduit assembly, and said second conduit assembly, said apparatus casing having a first aperture through which the portion of said cleaning chamber having said cleaning chamber external opening extends, said cleaning chamber and said apparatus casing being sealingly joined one to the other at said aperture, said apparatus casing further comprising a hinged access door overlying a second aperture for allowing access to said sump tank, said pump, said first conduit assembly, and said second conduit assembly for maintaining said apparatus.

2. The invention of claim 1 wherein said chamber sealing means is incorporated into said stencil/frame holder top by shaping said stencil/frame holder top for matingly coupling with said cleaning chamber at said cleaning chamber's external opening when said stencil/frame holder assembly is fully positioned within said cleaning chamber.

3. The invention of claim 2 further comprising a stencil/frame holder assembly hoist mechanism engaged with said stencil/frame holder assembly for moving said stencil/frame holder assembly along said tracks into and from said cleaning chamber.

4. The invention of claim 3 wherein said stencil/frame holder assembly hoist mechanism comprises a bi-directional electric motor mounted on a gantry framework cross member, a pinion keyed to said motor's armature shaft, a rack slidably mounted on said gantry framework cross member and engaged with said pinion, a chain coupled at a first chain end with an end of said rack and at a second chain end with said stencil/frame holder top, and a switch for actuating said motor alternatively in its two directions for alternatively moving said stencil/frame holder assembly along said tracks into and from said cleaning chamber under power of said motor.

5. The invention of claim 4 further comprising an electromagnetic brake mechanism mounted on said gantry framework cross member and associated with said armature shaft of said electric motor, said brake mechanism including a braking mechanism solenoid with a braking element mounted on a braking mechanism solenoid piston of said braking mechanism solenoid, said piston being spring-biased whereby said braking element is held against said armature shaft, said braking mechanism solenoid being connected with a power source whereby when power is applied to said braking mechanism solenoid, said piston is retracted within said braking mechanism solenoid against resistance of said spring thereby disengaging said braking element from said armature shaft, said braking mechanism for preventing movement of said stencil/frame holder assembly along said tracks unless power is directed to said braking mechanism solenoid.

6. The invention of claim 5 further comprising a safety stop mechanism for preventing accidental movement of said stencil/frame holder assembly toward said cleaning chamber, said safety stop mechanism comprising a safety stop solenoid and a safety stop solenoid piston, said safety stop solenoid piston having its external end fashioned into a ratchet lever permitting hinged movement of said external end through approximately forty-five degrees in a single plane, said safety stop solenoid and piston being constructed, mounted on an upright gantry framework member, and positioned relative to said track on said upright gantry framework member whereby said external end may be moved between an extended position where passage of said stencil/frame holder top toward said cleaning chamber opening is blocked by said external end and a retracted position where said stencil/frame holder top may pass said safety stop mechanism toward said cleaning chamber opening, said safety stop solenoid piston being spring biased toward said extended position, said safety stop solenoid being connected with a source of intermittent power whereby, when power is applied to said safety stop solenoid, said safety stop solenoid piston is retracted to permit said stencil/frame top to be directed toward said cleaning chamber opening for a cleaning cycle of said apparatus.

7. The invention of claim 6 wherein an end of said pipe which connects said cleaning chamber drain port with said sump tank extends into the interior of said sump tank and has an external annular flange at said end for permitting a filter bag to be attached at said end of said pipe for filtering particulate from said liquid as said liquid flows from said cleaning chamber.

8. The invention of claim 7 further comprising a cartridge filter assembly incorporated into said second conduit assembly for diverting said liquid from said second conduit assembly, filtering particulates from said liquid, and reintroducing said liquid into said second conduit assembly prior to said liquid's reaching said rotatable spray arm.

9. The invention of claim 8 wherein said cartridge filter assembly includes a filter cartridge capable of filtering particulates as small as five microns in diameter.

10. The invention of claim 8 further comprising a timer/control unit which, through selectively self-actuated internal switches respectively controlling current flow to said bi-directional motor, to said pump, to said brake mechanism solenoid, and to said safety stop solenoid, actuates said electric motor, said pump, said brake mechanism solenoid, and said safety stop solenoid in a prescribed temporal arrangement for sequentially disengaging said brake mechanism, retracting said external end of said safety stop solenoid piston, actuating said electric motor in the direction for moving said stencil/frame holder assembly from a starting position into said cleaning chamber and thereby sealing said cleaning chamber's external opening, reengaging said braking mechanism after said stencil/frame holder top is seated at said cleaning chamber opening, re-extending said safety stop solenoid piston, actuating said pump for a prescribed period of time, following a duration of time after operation of said pump disengaging said brake mechanism, actuating said electric motor in the direction for moving said stencil/frame holder assembly from said cleaning chamber, and reengaging said braking mechanism after said stencil/frame holder assembly returns to said starting position, said timer/control unit further comprising sensing device receiving means for receiving a signal from an external sensing device and interrupting power to said bi-directional motor, said pump, said brake mechanism solenoid, and said safety stop solenoid when said signal is received.

11. The invention of claim 10 further comprising a second rotatable spray arm substantially identical to said first rotatable spray arm, said second spray arm being rotatably supported on said second cleaning chamber wall, said second spray arm having a plurality of nozzles along its length fixedly-oriented for directing a liquid through said nozzles perpendicularly to said length of said second spray arm and transversely to a second plane of rotation of said second spray arm in a direction intersecting said first plane of rotation of said first spray arm, said second spray arm being in fluid communication with said second conduit assembly and thereby conducting said liquid from said pump through said second spray arm's nozzles for cleaning a second side of said planar object opposite said first side.

12. The invention of claim 11 wherein said first and second rotatable spray arms each comprise two spray arm tubes coupled at interior ends and in fluid communication with an internal chamber of a rotatably mounted hub, said hubs in turn being in fluid communication with said second conduit assembly, said spray arm tubes external ends being occluded, said spray arm tubes having said nozzles situated along their lengths, said two spray arm tubes of each said spray arms being respectively oriented whereby said liquid flowing from said nozzles imparts rotation to said spray arms and whereby said liquid from said first and second spray arms transversely impinges said first and second planar object surfaces respectively, said rotation and nozzle orientation of said spray arms creating waves of said liquid to pass over said planar object surfaces for wiping material from said planar object surfaces.

13. The invention of claim 12 further comprising refrigeration cooling coils extending from outside of said apparatus casing into said cleaning chamber and said sump tank, said cooling coils having fittings formed at cooling coil ends situated outside of said apparatus casing permitting connection of said cooling coils with refrigeration components whereby said cooling coils may act to cool said liquid within said cleaning chamber and said sump tank for reducing temperature at which said liquid is used within said apparatus.

14. The invention of claim 13 further comprising distillation means for distilling said liquid having been used in said apparatus and being saturated with contaminants washed from said planar object surfaces.

15. The invention of claim 14 wherein said distillation means comprises a distillation tank with heating means incorporated therein, a recovery tank for receiving condensed, distilled said liquid, and cooling coils in sealed fluid communication with said the respective interiors of said distillations tank and said recover tank, said distillation means being incorporated into said second conduit by means of a bi-directional valve whereby said liquid from said pump may be diverted from said second conduit assembly into a still pipe which is in fluid communication with said distillation tank thereby removing said liquid from said sump tank to said distillation means for distillation.

16. The invention of claim 15 further comprising a light curtain system, said light curtain system comprising an optical transceiver and a plurality of mirrors oriented whereby vertical planes of light are projected from said optical transceiver around said apparatus' perimeter to encompass said apparatus and are received by said transceiver, said transceiver having light plane interruption detecting means for detecting a breach of said light plane and further having means for sending an electrical signal to said sensing device receiving means of said timer/control unit, said light curtain system in conjunction with said sensing device receiving means for interrupting operation of said apparatus when a user extends a bodily member within the perimeter defined by said light planes to prevent bodily injury.

17. The invention of claim 16 wherein said pump is designed for and capable of propelling liquid at a rate of 40 gallons per minute at a pressure of 80 water feet through said output port.

18. An apparatus for cleaning solder paste from a first surface of a substantially planar object used in surface-mount-technology manufacturing processes comprising:
a first rotatable spray arm being situated within a cleaning chamber and rotatably supported on a first cleaning chamber wall of said cleaning chamber, said first spray arm having a plurality of nozzles along its length fixedly oriented for directing a liquid through said nozzles perpendicularly to said length of said first spray arm and transversely to a first plane of rotation of said first spray arm in a direction intersecting a second cleaning chamber wall opposite said first cleaning chamber wall, said cleaning chamber having a cleaning chamber external opening through which said planar object may be inserted and removed from said cleaning chamber and a cleaning chamber drain port through which said liquid may drain from said cleaning chamber;
a second rotatable spray arm substantially identical to said first rotatable spray arm, said second spray arm being rotatably supported on said second cleaning chamber wall, said second spray arm having a plurality of nozzles along its length fixedly oriented for directing a liquid through said nozzles perpendicularly to said length of said second spray arm and transversely to a second plane of rotation of said second spray arm in a direction intersecting said first plane of rotation of said first spray arm, said second spray arm being in fluid communication with said second conduit assembly and thereby conducting said liquid from said pump through said second spray arm's nozzles for cleaning a second side of said planar object opposite said first side;

a sump tank in fluid communication with said cleaning chamber drain port by means of a pipe sealingly welded to said drain port and extending into said sump tank for receiving all of said liquid which drains from said cleaning chamber, an end of said pipe extending into the interior of said sump tank and having an external annular flange at said end for permitting a filter bag to be attached at said end of said pipe for filtering particulate from said liquid as said liquid flows from said cleaning chamber;

a stencil/frame holder assembly for holding said planar object in said cleaning chamber so a surface of said planar object is oriented substantially parallel with said first plane of rotation and positioned whereby said liquid from said nozzles strikes said surface, said stencil/frame holder assembly being sized for carrying said planar object through said cleaning chamber external opening for placing said planar object in said cleaning chamber or removing said planar object therefrom, said stencil/frame holder being a frame-like assembly comprising two vertically oriented side members rigidly joined to form a rectangular structure with a horizontally oriented stencil/frame holder top and a horizontally oriented stencil/frame support member, and further comprising a horizontally oriented retainer rail slidably engaged with said side members, said retainer rail and said stencil/frame support member each having a channel facing inward of said rectangular structure for securing said planar object for cleaning by said apparatus, said stencil/frame holder top and said stencil frame support member being slidably coupled with tracks joined with and supported by a gantry framework in turn mounted on and supported by said apparatus casing, said tracks extending from said cleaning chamber external opening to an area outside of said cleaning chamber along said gantry framework sufficiently for slidably carrying said planar object held by said stencil/frame holder fully into and from said cleaning chamber;

a pump having an input port and an output port for propelling said liquid introduced into said input port at a low pressure from said output port at an elevated pressure;

a first conduit assembly in sealed fluid communication with a sump tank exit port and with said pump's input port for drawing said liquid from said sump tank to said input port;

a second conduit assembly in sealed fluid communication with said pump's output port and with said first and second rotatable spray arms for conducting said liquid from said pump to said spray arms;

an apparatus casing sized and shaped for substantially enclosing within its bounds said cleaning chamber, said sump tank, said pump, said first conduit assembly, and said second conduit assembly, said apparatus casing having a first aperture through which said cleaning chamber's face having said cleaning chamber external opening extends, said cleaning chamber and said apparatus casing being sealingly joined one to the other at said aperture, said apparatus casing further comprising a hinged access door overlying a second aperture for allowing access to said sump tank, said pump, said first conduit assembly, and said second conduit assembly for maintaining said apparatus;

chamber sealing means incorporated into said stencil/frame holder top by shaping said stencil/frame holder top for matingly coupling with said cleaning chamber at said cleaning chamber external opening when said stencil/frame holder assembly is maximally positioned within said cleaning chamber;

a stencil/frame holder assembly hoist mechanism engaged with said stencil/frame holder assembly for moving said stencil/frame holder assembly along said tracks into and from said cleaning chamber, said stencil/frame holder assembly hoist mechanism comprising a bi-directional electric motor mounted on a gantry framework cross member, a pinion keyed to said motor's armature shaft, a rack slidably mounted on said gantry framework cross member and engaged with said pinion, a chain coupled at a first chain end with an end of said rack and at a second chain end with said stencil/frame holder top, and a switch for actuating said motor alternatively in its two directions for alternatively moving said stencil/frame holder assembly along said tracks into and from said cleaning chamber under power of said motor;

an electromagnetic brake mechanism mounted on said gantry framework cross member and associated with said armature shaft of said electric motor, said brake mechanism including a braking mechanism solenoid with a braking element mounted on a braking mechanism solenoid piston of said braking mechanism solenoid, said piston being spring-biased whereby said braking element is held against said armature shaft, said braking mechanism solenoid being connected with a power source whereby when power is applied to said braking mechanism solenoid, said piston is retracted within said braking mechanism solenoid against resistance of said spring thereby disengaging said braking element from said armature shaft, said braking mechanism for preventing movement of said stencil/frame assembly along said tracks unless power is directed to said braking mechanism solenoid;

a safety stop mechanism for preventing accidental movement of said stencil/frame holder assembly toward said cleaning chamber, said safety stop mechanism comprising a safety stop solenoid and a safety stop solenoid piston, said safety stop solenoid piston having its external end fashioned into a ratchet lever permitting hinged movement of said external end through approximately forty five degrees in a single plane, said safety stop solenoid and piston being constructed, mounted on an upright gantry framework member, and positioned relative to said track on said upright gantry framework member whereby said external end may be moved between an extended position where passage of said stencil/frame holder top toward said cleaning chamber opening is blocked by said external end and a retracted position where said stencil/frame holder top may pass said safety stop mechanism toward said cleaning chamber opening, said safety stop solenoid piston being spring biased toward said extended position, said safety stop solenoid being connected with a source of intermittent power whereby, when power is applied to said safety stop solenoid, said safety stop solenoid piston is retracted to permit said stencil/frame top to be directed toward said cleaning chamber opening for a cleaning cycle of said apparatus;

a cartridge filter assembly incorporated into said second conduit assembly for diverting said liquid from said second conduit assembly, filtering particulates from said liquid, and reintroducing said liquid into said second conduit assembly prior to said liquid's reaching said first and second spray arms;

a timer/control unit which, through selectively self-actuated internal switches respectively controlling current flow to said bi-directional motor, to said pump, to said brake mechanism solenoid, and to said safety stop solenoid, actuates said electric motor, said pump, said brake mechanism solenoid, and said safety stop solenoid in a prescribed temporal arrangement for sequentially disengaging said brake mechanism, retracting said external end of said safety stop solenoid piston, actuating said electric motor in the direction for moving said stencil/frame holder assembly from a starting position into said cleaning chamber and thereby sealing said cleaning chamber's external opening, reengaging said braking mechanism after said stencil/frame holder top is seated at said cleaning chamber opening, re-extending said safety stop solenoid piston, actuating said pump for a prescribed period of time, disengaging said brake mechanism following a duration of time after operation of said pump; actuating said electric motor in the direction for moving said stencil/frame holder assembly from said cleaning chamber, and reengaging said braking mechanism after said stencil/frame holder assembly returns to said starting position, said timer/control unit further comprising sensing device receiving means for receiving a signal from an external sensing device and interrupting power to said bi-directional motor, said pump, said brake mechanism solenoid, and said safety stop solenoid when said signal is received;

refrigeration cooling coils extending from outside of said apparatus casing into said cleaning chamber and said sump tank, said cooling coils having fittings formed at cooling coil ends situated outside of said apparatus casing permitting connection of said cooling coils with refrigeration components whereby said cooling coils may act to cool said liquid within said cleaning chamber and said sump tank for reducing temperature at which said liquid is used within said apparatus; and distillation means for distilling said liquid having been used in said apparatus and being saturated with contaminants washed from said stencil/frame combination surfaces, said distilling means comprising a distillation tank with heating means incorporated therein, a recovery tank for receiving condensed, distilled said liquid, and cooling coils in sealed fluid communication with said respective interiors of said distillations tank and said recover tank, said distillation means being incorporated into said second conduit by means of a bi-directional valve whereby said liquid from said pump may be diverted from said second conduit assembly into a still pipe which is in fluid communication with said distillation tank thereby removing said liquid from said sump tank to said distillation means for distillation.

19. The invention of claim 18 wherein said first and second rotatable spray arms each comprise two spray arm tubes coupled at interior ends and in fluid communication with an internal chamber of a rotatably mounted hub, said hubs in turn being in fluid communication with said second conduit assembly, said spray arm tubes external ends being occluded, said spray arm tubes having said nozzles situated along their lengths, said two spray arm tubes of each said spray arms being respectively oriented whereby said liquid flowing from said nozzles imparts rotation to said spray arms and whereby said liquid from said first and second spray arms transversely impinges said first and second planar object surfaces respectively, said rotation and nozzle orientation of said spray arms creating waves of said liquid to pass over said planar object surfaces for wiping material from said planar object surfaces.

20. The invention of claim 19 further comprising a light curtain system, said light curtain system comprising an optical transceiver and a plurality of mirrors oriented whereby vertical planes of light are projected from said optical transceiver around said apparatus, perimeter to encompass said apparatus and are received by said transceiver, said transceiver having light plane interruption detecting means for detecting a breach of said light plane and further having means for sending an electrical signal to said sensing device receiving means of said timer/control unit, said light curtain system in conjunction with said sensing device receiving means for interrupting operation of said apparatus when a user extends a bodily member within the perimeter defined by said light planes to prevent bodily injury.

* * * * *